US012796284B2

(12) United States Patent
Zhang

(10) Patent No.: US 12,796,284 B2
(45) Date of Patent: Nov. 10, 2026

(54) DISPLAY PANEL AND PREPARATION METHOD THEREOF

(71) Applicant: SHENZHEN CHINA STAR OPTOELECTRONICS SEMICONDUCTOR DISPLAY TECHNOLOGY CO., LTD., Shenzhen (CN)

(72) Inventor: Qianyi Zhang, Shenzhen (CN)

( * ) Notice: Subject to any disclaimer, the term of this patent is extended or adjusted under 35 U.S.C. 154(b) by 1206 days.

(21) Appl. No.: 17/779,147

(22) PCT Filed: May 18, 2022

(86) PCT No.: PCT/CN2022/093480

§ 371 (c)(1),
(2) Date: Oct. 26, 2023

(87) PCT Pub. No.: WO2023/201813

PCT Pub. Date: Oct. 26, 2023

(65) Prior Publication Data

US 2024/0172524 A1 May 23, 2024

(30) Foreign Application Priority Data

Apr. 20, 2022 (CN) ......................... 202210419944.7

(51) Int. Cl.
*H10K 59/80* (2023.01)
*H10K 59/12* (2023.01)
*H10K 59/122* (2023.01)

(52) U.S. Cl.
CPC ... *H10K 59/80522* (2023.02); *H10K 59/1201* (2023.02); *H10K 59/122* (2023.02)

(58) Field of Classification Search
None
See application file for complete search history.

(56) References Cited

U.S. PATENT DOCUMENTS 9,478,591 B2 * 10/2016 Nam .................... H10K 59/122
2015/0179719 A1 * 6/2015 Nam .................... H10K 59/122
438/4

(Continued)

FOREIGN PATENT DOCUMENTS

CN 104282723 A 1/2015
CN 104733500 A 6/2015

(Continued)

OTHER PUBLICATIONS

Chinese Office Action issued in corresponding Chinese Patent Application No. 202210419944.7 dated Nov. 1, 2024, pp. 1-7.

(Continued)

*Primary Examiner* — Long Pham

(57) ABSTRACT

The present disclosure relates to a display panel and a method for preparing a display panel, wherein in a cathode lapping region, the display panel comprises an array substrate, an auxiliary electrode, a light-emitting material layer, and a cathode. An undercut groove is disposed between the auxiliary electrode and the array substrate. The light-emitting material layer is filled in the undercut groove. By filling the light-emitting material layer in the undercut groove, an exposed portion of the auxiliary electrode is in contact with the cathode, thus increasing a contact area between the cathode and the auxiliary electrode.

20 Claims, 4 Drawing Sheets

(56) References Cited

U.S. PATENT DOCUMENTS

| | | | | |
|---|---|---|---|---|
| 2016/0293888 | A1* | 10/2016 | Shim | H10K 59/122 |
| 2018/0261783 | A1 | 9/2018 | Yun et al. | |
| 2025/0176400 | A1* | 5/2025 | Lin | H10K 59/126 |

FOREIGN PATENT DOCUMENTS

| | | | |
|---|---|---|---|
| CN | 106057844 | A | 10/2016 |
| CN | 106206645 | A | 12/2016 |
| CN | 109103215 | A | 12/2018 |
| CN | 114284331 | A | 4/2022 |
| CN | 114335116 | A | 4/2022 |

OTHER PUBLICATIONS

International Search Report in International application No. PCT/CN2022/093480,mailed on Nov. 25, 2022.

Written Opinion of the International Search Authority in International application No. PCT/CN2022/093480,mailed on Nov. 25, 2022.

* cited by examiner

DISPLAY PANEL AND PREPARATION METHOD THEREOF

TECHNICAL FIELD

The present disclosure relates to a technical field of display, and in particular, to a display panel and a preparation method thereof.

BACKGROUND

Cathodes of display panels in the prior art are usually prepared from materials with high resistivity such as thin metallic silver, resulting in a large voltage drop, which leads to a large difference between an actual driving voltage and a power supply voltage of an array substrate. In large-size display panels, it shows as a large area of uneven brightness, which affects display effect.

Technical Problem

Therefore, display panels in the prior art have a technical problem of large voltage drop in cathode.

Technical Solution

Embodiments of the present disclosure provide a display panel and a method for preparing a display panel, which can alleviate the technical problem that display panels in the prior art have a large voltage drop in cathode.

Embodiments of the present disclosure provide a display panel, which comprises a cathode lapping region, wherein the cathode lapping region comprises:

an array substrate;

an auxiliary electrode disposed above the array substrate;

a light-emitting material layer disposed above the array substrate;

a cathode disposed on the light-emitting material layer and the auxiliary electrode, the cathode is lapped with the auxiliary electrode;

wherein a passivation layer, a planarization layer, and a pixel definition layer are further disposed sequentially on the array substrate; a via hole penetrating through the passivation layer, the planarization layer, and the pixel definition layer is disposed on the cathode lapping region; the auxiliary electrode is disposed in the via hole; an undercut groove is formed between the auxiliary electrode and the array substrate, and the undercut groove is filled with the light-emitting material layer.

Optionally, in some embodiments of the present disclosure, a surface of the auxiliary electrode away from the array substrate is disposed in a convex shape, and the convex protrudes toward one side away from the array substrate.

Optionally, in some embodiments of the present disclosure, the auxiliary electrode comprises a first electrode and a second electrode disposed on one side of the first electrode away from the array substrate, the first electrode and the array substrate form the undercut groove, a surface of the second electrode away from the array substrate is disposed in a convex shape, and the convex protrudes toward one side of the array substrate away from the array substrate.

Optionally, in some embodiments of the present disclosure, the array substrate comprises a substrate and a source and a drain on one side of the substrate, and the first electrode is disposed in the same layer as the source and the drain.

Optionally, in some embodiments of the present disclosure, the display panel further comprises an anode connected to the source, and the second electrode is disposed in the same layer as the anode.

Optionally, in some embodiments of the present disclosure, an upper surface of the second electrode is not disposed with a light-emitting material layer, and the cathode covers the second electrode.

Optionally, in some embodiments of the present disclosure, the first electrode comprises a first portion, a second portion disposed on one side of the first portion away from the array substrate, and an orthographic projection of the first portion on the array substrate is smaller than an orthographic projection of the second portion on the array substrate.

Optionally, in some embodiments of the present disclosure, the first portion and the second portion of the first electrode are integrally disposed.

Optionally, in some embodiments of the present disclosure, a contact area of the cathode with the second electrode and the first electrode is larger than an area of an upper surface of the second electrode.

Optionally, in some embodiments of the present disclosure, the convex is an independent member, a material for preparing the convex is a conductive material, and the material for preparing the convex may be different from that of the second electrode.

Optionally, in some embodiments of the present disclosure, the convex shape is a triangular cone shape, and a lower surface of the second electrode is in flush contact with the upper surface of the first electrode.

Optionally, in some embodiments of the present disclosure, an apex angle of the convex on one side away from the array substrate is greater than or equal to 60 degrees, and the convex has a thickness of greater than or equal to 110 nm.

Optionally, in some embodiments of the present disclosure, a pixel definition layer and a planarization layer are further disposed above the array substrate, and an orthographic projection of the pixel definition layer and the planarization layer on the substrate is staggered with an orthographic projection of the undercut groove on the substrate.

Optionally, in some embodiments of the present disclosure, a material for preparing the pixel definition layer and the planarization layer is a positive photoresist material.

Optionally, in some embodiments of the present disclosure, the cathode covers the second electrode.

Optionally, in some embodiments of the present disclosure, a portion of the cathode is disposed in the undercut groove, and the portion of the cathode located in the undercut groove may be in contact with one side of the first portion.

Optionally, in some embodiments of the present disclosure, a lateral depth of the undercut groove is greater than 2 microns.

Optionally, in some embodiments of the present disclosure, a material for preparing the second electrode and the cathode is selected from any one of indium tin oxide, indium zinc oxide, molybdenum titanium, and titanium.

Embodiments of the present disclosure further provide a method for preparing a display panel, which comprises:

providing an array substrate;

preparing an auxiliary electrode on the array substrate, wherein an undercut groove is formed between the auxiliary electrode and the array substrate;

preparing a passivation layer, a planarization layer, and a pixel definition layer sequentially on the array substrate;

forming a via hole penetrating through the passivation layer, the planarization layer, and the pixel definition layer, so that the auxiliary electrode is located in the via hole; and preparing a light-emitting material on one side of the pixel definition layer away from the array substrate, and the light-emitting material is filled in the undercut groove in a cathode lapping region.

Optionally, in some embodiments of the present disclosure, the method further comprises a step of preparing an auxiliary electrode, wherein the auxiliary electrode comprises a first portion and a second portion disposed on the first portion, and the step of preparing the auxiliary electrode comprises preparing an undercut groove by etching the first portion through a photolithography process, wherein the second portion covers the first portion, and a depth of the undercut groove is greater than 2 microns.

Technical Effects

In the present application, an undercut groove is formed between the auxiliary electrode and the array substrate, and an upper surface of an auxiliary electrode is disposed in a convex shape, so that a light-emitting material layer is filled in the undercut groove to expose a part of the auxiliary electrode, and a cathode is in contact with the auxiliary electrode surface. By increasing a contact area between the cathode and the auxiliary electrode, a contact resistance of the cathode is reduced, thereby alleviating the technical problem that display panels in the prior art have a large voltage drop in cathode.

BRIEF DESCRIPTION OF THE DRAWINGS

In order to more clearly describe the technical solutions in embodiments of the present disclosure or technical solutions in the prior art, hereinafter, the appended drawings used for describing the embodiments will be briefly introduced. The appended drawings described below are only directed to some embodiments of the present disclosure, and for a person skilled in the art, without expenditure of creative labor, other drawings can be derived on the basis of these appended drawings.

Figure 1:
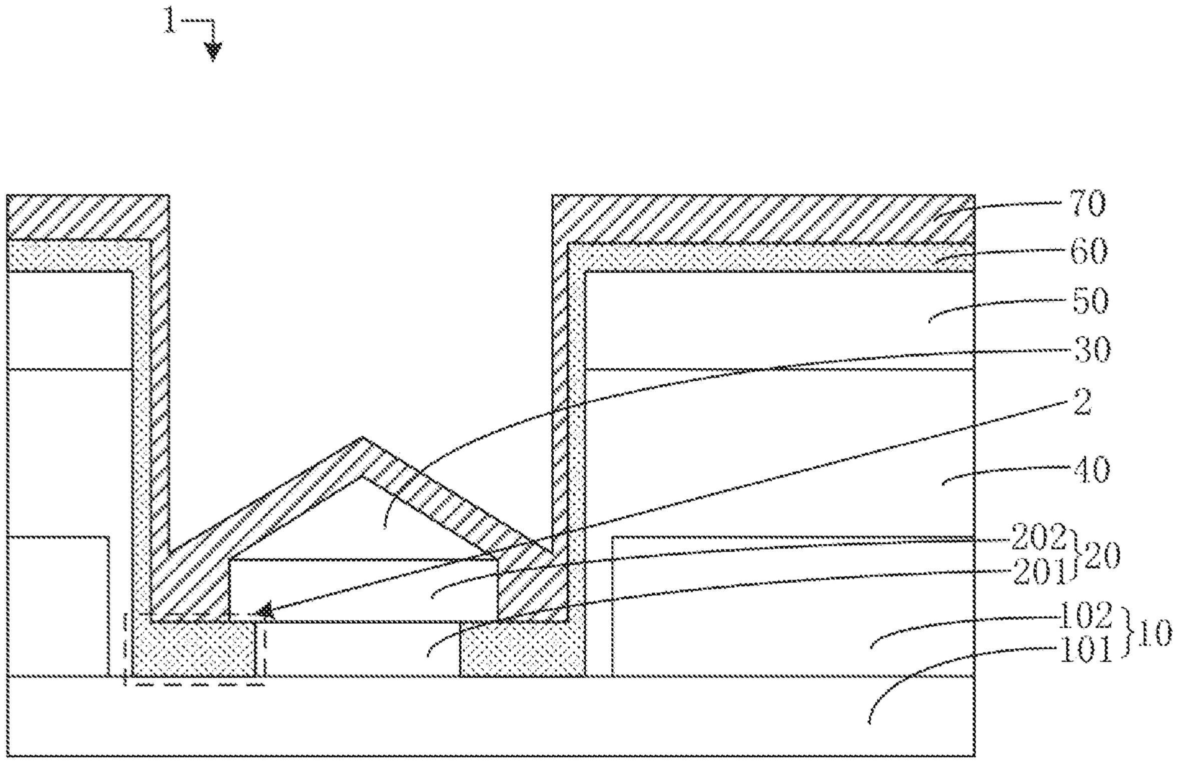
FIG. 1 is a schematic cross-sectional view of a display panel provided by the present disclosure.

Description of reference numbers:

| Reference number | Component name | Reference number | Component name |
|---|---|---|---|
| 1 | cathode lapping region | 2 | Undercut groove |
| 10 | Array substrate | 20 | First electrode |
| 30 | Second electrode | 40 | Planarization layer |
| 50 | Pixel definition layer | 60 | Light-emitting material layer |
| 70 | Cathode | | |
| 102 | Passivation layer | 101 | Substrate |
| 202 | Second portion | 201 | First portion |

DETAILED DESCRIPTION

Embodiments

Hereinafter, technical solutions in embodiments of the present disclosure will be clearly and completely described with reference to the accompanying drawings in embodiments of the present disclosure. Apparently, the described embodiments are part of, not all of, the embodiments of the present disclosure. All the other embodiments, obtained by a person with ordinary skill in the art on the basis of the embodiments in the present disclosure without expenditure of creative labor, belong to the protection scope of the present disclosure. In addition, it should be understood that specific embodiments described herein are only used to illustrate and explain the present disclosure, and are not intended to limit the present disclosure. In the present disclosure, unless otherwise stated, orientation words such as “up” and “down” generally refers to “up” and “down” in the actual use or working state of a device, and specifically refers to the drawing direction in the drawings; while “inside” and “outside” is discussed with respect to outlines of a device.

In display panels of the prior art, a material for preparing a cathode usually has a high resistivity and a thin thickness, resulting in a large voltage drop of the display panel, so that the display panel is shown as a large area of uneven brightness, thereby affecting display effect. In order to reduce voltage drop in cathode, in cathode lapping region 1, a cathode is usually disposed to be contact with an auxiliary electrode through a via hole penetrating at least a light-emitting material layer, thereby reducing resistance of the cathode. However, the cathode is only in contact with an upper surface of the auxiliary electrode, so contact area is small, resulting in a large contact resistance, effect of reducing the cathode resistance is not obvious, as a result, there is still a technical problem of a large voltage drop in cathode.

Therefore, there is an urgent need in the prior art to provide a display panel capable of reducing cathode contact resistance of the cathode lapping region 1.

With reference to FIG. 1, the present disclosure provides a display panel. In cathode lapping region 1, the display panel comprises an array substrate 10, an auxiliary electrode, a light-emitting material layer 60, and a cathode 70. The auxiliary electrode is disposed above the array substrate 10. The light-emitting material layer 60 is disposed above the array substrate 10. The cathode 70 is disposed on the light-emitting material layer 60 and the auxiliary electrode, the cathode 70 is lapped with the auxiliary electrode. A passivation layer 102, a planarization layer 40, and a pixel definition layer 50 are further disposed sequentially on the array substrate 10. A via hole penetrating through the passivation layer 102, the planarization layer 40, and the pixel definition layer 50 is disposed on the cathode lapping region 1. The auxiliary electrode is disposed in the via hole, an undercut groove 2 is formed between the auxiliary electrode and the array substrate 10, and the undercut groove 2 is filled with the light-emitting material layer 60.

In this embodiment, by filling the light-emitting material layer in the undercut groove, an exposed portion of the auxiliary electrode is in contact with the cathode, so that a contact area between the cathode and the auxiliary electrode is increased, and a contact resistance of the cathode is reduced, thereby alleviating the technical problem that display panels in the prior art have a large voltage drop in cathode.

The auxiliary electrode comprises a first electrode 20 and a second electrode 30 disposed on one side of the first electrode 20 away from the array substrate 10.

The light-emitting material layer 60 is in the same layer as a light-emitting layer, and is prepared by one-step process. The display panel comprises a light-emitting region and a cathode lapping region 1, and the light-emitting layer is disposed in the light-emitting region.

The array substrate further comprises a substrate 101 and a passivation layer 102 disposed on the substrate 101, a via hole is disposed in the passivation layer 102, and the first electrode is located in the via hole.

It can be understood that the light-emitting material layer 60 is filled in the undercut groove 2, and an exposed portion of the first electrode 20 is in surface contact with the cathode 70, so that a contact area between the cathode 70 and the second electrode 30 and the first electrode 20 is increased, and a contact resistance of the cathode 70 is reduced, thereby further reducing resistance of the cathode 70.

Technical solutions of the present disclosure will be described now with reference to specific embodiments.

In an embodiment, a surface of the auxiliary electrode away from the array substrate 10 is disposed in a convex shape, and the convex protrudes toward one side away from the array substrate 10.

In an embodiment, the first electrode 20 and the array substrate 10 form the undercut groove 2, and a surface of the second electrode 30 away from the array substrate 10 is disposed in a convex shape, and the convex protrudes away from one side of the array substrate 10.

In an embodiment, the array substrate 10 comprises a substrate 101 and a source and a drain on one side of the substrate. The display panel further comprises an anode connected to the source, the first electrode 20 is disposed in the same layer as the source and the drain, and the second electrode 30 is disposed in the same layer as the anode.

In an embodiment, an upper surface of the second electrode 30 is not disposed with a light-emitting material layer 60, and the cathode 70 covers the second electrode 30.

It can be understood that light-emitting material layer fills in the undercut groove, so that a portion or all of the upper surface of the second electrode 30 can be exposed for contact with the cathode, so as to increase contact area between the cathode and the auxiliary electrode, thereby reducing contact resistance, and thus reducing voltage drop in cathode.

In this embodiment, an upper surface of the second electrode 30 is not disposed with a light-emitting material layer, that is, the upper surface is completely exposed for increasing contact area with the cathode 70. Design of completely exposing the upper surface of the second electrode 30 has a better effect on reducing contact resistance of the cathode 70.

In an embodiment, the first portion 201 and the second portion 202 of the first electrode 20 are integrally disposed.

The array substrate 10 further comprises a source/drain layer, the source/drain layer comprises a source and a drain, and the first electrode 20 is in the same layer as the source/drain.

It can be understood that the first electrode 20 formed at the same time when preparing the source/drain without an additional process.

In this embodiment, production process is simplified and cost is reduced by disposing the first electrode 20 in the same layer as existing film layers.

In an embodiment, an upper surface of the second electrode 30 is disposed in a convex shape, and the convex protrudes away from the substrate 101.

The convex shape may be selected from any one of a trapezoid shape, a cone shape, and a triangle shape.

It can be understood that organic materials are guided into the undercut groove 2 through the convex, and an upper surface of the convex facilitates the filling of the light-emitting material layer 60 into the undercut groove 2, so that the light-emitting material layer 60 is prevented from being disposed on surfaces of the first electrode 20 and the second electrode 30, and contact area between the cathode 70 and the second electrode 30 and the first electrode 20 is increased, thereby reducing contact resistance between the cathode 70 and the second electrode 30 and the first electrode 20.

It can be understood that upper surface of the second electrode 30 requires to have at least one inclined surface for guiding the organic materials into the undercut groove 2.

It should be noted that the upper surface of the second electrode 30 is convex, so that contact area between the upper surface of the second electrode 30 and the cathode 70 can also be increased.

In this embodiment, by setting the upper surface of the second electrode 30 as a convex shape, light-emitting materials of the light-emitting material layer 60 are facilitated to enter the undercut groove 2, so that the first electrode 20 is partially exposed to so as reduce contact resistance of the cathode 70.

In an embodiment, a contact area of the cathode 70 with the second electrode 30 and the first electrode 20 is larger than an area of an upper surface of the second electrode 30.

One side of the cathode 70 away from the array substrate 10 may not be disposed with a light-emitting material layer, i.e., one side of the cathode away from the array substrate is completely exposed, and meanwhile, the cathode is also in partially contact with one side of the auxiliary electrode.

In this embodiment, contact area between the cathode 70 and the auxiliary electrode is further defined, so that the cathode resistance is reduced, and voltage drop of the cathode 70 is reduced.

In an embodiment, the cathode 70 is only in contact with the second electrode 30, and an upper surface of the second electrode 30 is configured to have a convex structure, which is an independent member.

The cathode 70 is in contact with one side of the second electrode 30.

A material for preparing the convex is a conductive material, and the material for preparing the convex may be different from that of the second electrode 30.

The convex structure may be the same as the second electrode 30.

In this embodiment, contact resistance of the cathode 70 is reduced by further disposing an independent member on a surface of the second electrode 30, wherein the independent member is a convex.

In an embodiment, the convex shape is a triangular cone shape, and a lower surface of the second electrode 30 is in flush with an upper surface of the second portion 202.

In an embodiment, an apex angle of the convex is greater than or equal to 60 degrees, and the convex has a thickness of greater than or equal to 110 nm.

The apex angle is an angle of one side of the convex away from the array substrate.

In an embodiment, a pixel definition layer 50 and a planarization layer 40 are further disposed above the array substrate 10, and an orthographic projection of the pixel definition layer 50 and the planarization layer 40 on the substrate 101 is staggered with an orthographic projection of the undercut groove 2 on the substrate 101.

The pixel definition layer 50 may has a thickness of t 2000 Angstroms.

It can be understood that the planarization layer 40, the pixel definition layer 50 within the undercut groove 2 can be removed, so that the undercut groove 2 is only used to contain the light-emitting material layer 60.

In an embodiment, a material for preparing the pixel definition layer 50 and the planarization layer 40 is a positive photoresist material.

In an embodiment, materials for preparing the pixel definition layer 50, the planarization layer 40 are the same.

A material for preparing the planarization layer 40 is a material with high leveling property.

In this embodiment, the material for the planarization layer 40 with high leveling property is advantageous for the planarization layer 40 to fill the undercut groove 2.

In an embodiment, the cathode 70 is further partially disposed in the undercut groove 2, and a portion of the cathode 70 located in the undercut groove 2 may be in contact with one side of the first portion 201.

In this embodiment, the cathode located in the undercut groove is also in contact with one side of the first electrode, thus further increasing contact area and reducing contact resistance.

In an embodiment, a material for preparing the second electrode 30 and the cathode 70 is selected from any one of indium tin oxide, indium zinc oxide, molybdenum titanium, and titanium.

Materials for preparing the second electrode 30 and the cathode 70 may be the same.

In an embodiment, a lateral depth of the undercut groove 2 is greater than 2 microns.

Width of the second portion 202 is at least 4 microns greater than that of the first portion 201.

It can be understood that, in the prior art, when preparing a light-emitting layer in a display panel, the light-emitting material layer 60 is easily prepared synchronously in the cathode lapping region 1, and the light-emitting material layer 60 will cover sides of the first electrode 20 and the second electrode 30, resulting in a small contact area and larger contact resistance between the cathode 70 and the second electrode 30.

In this embodiment, by defining a lateral depth of the undercut groove 2, it is ensured that there is sufficient containing space for the undercut groove 2 to be filled with the light-emitting layer 60.

With reference to FIGS. 2A to 2G and FIG. 3, an embodiment of the present disclosure provides a method for preparing a display panel, which comprises:

S1: providing an array substrate 10;

S2: preparing an auxiliary electrode over the array substrate 10, wherein an undercut groove 2 is formed between the auxiliary electrode and the array substrate 10;

S3: preparing a passivation layer 102, a planarization layer 40, and a pixel definition layer 50 sequentially on the array substrate 10;

S4: forming a via hole penetrating through the passivation layer 102, the planarization layer 40, and the pixel definition layer 50, so that the auxiliary electrode is located in the via hole; and S5: preparing a light-emitting material layer 60 on one side of the pixel definition layer 50 away from the array substrate 10, and the light-emitting material layer is filled in the undercut groove 2 in cathode lapping region 1.

A contact area of the cathode 70 with the auxiliary electrode is larger than an area of an upper surface of the auxiliary electrode.

Furthermore, a contact area of the cathode 70 with the second electrode 30 and the first electrode 20 is larger than an area of an upper surface of the second electrode 30.

Figure 2A:
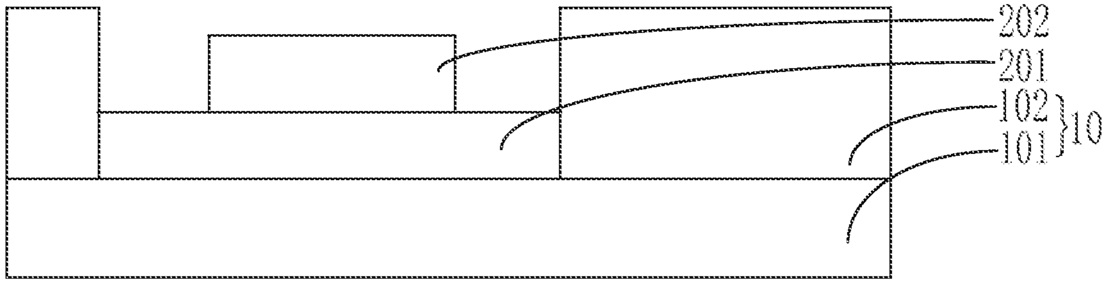
FIG. 2A is a schematic cross-sectional view of a first method for preparing a display panel provided by the present disclosure.

With reference to FIG. 2A, an array substrate 10 is provided, wherein the array substrate 10 comprises a first electrode 20.

Figure 2B:
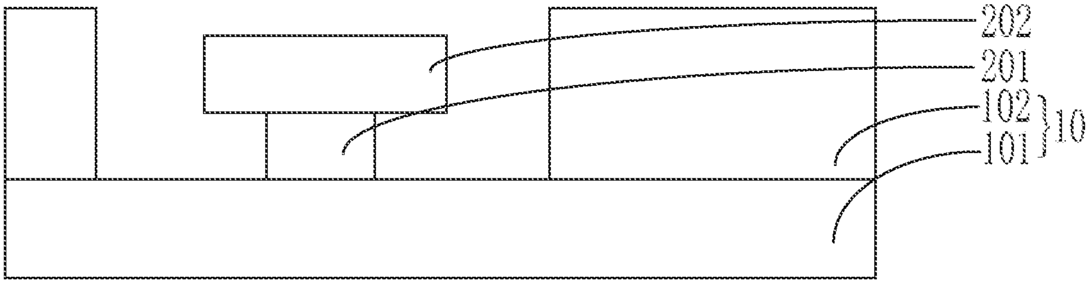
FIG. 2B is a schematic cross-sectional view of a second method for preparing a display panel provided by the present disclosure.

With reference to FIG. 2B, a first portion 201 and a second portion 202 of a first electrode 20, and a undercut groove 2 are prepared.

Figure 2C:
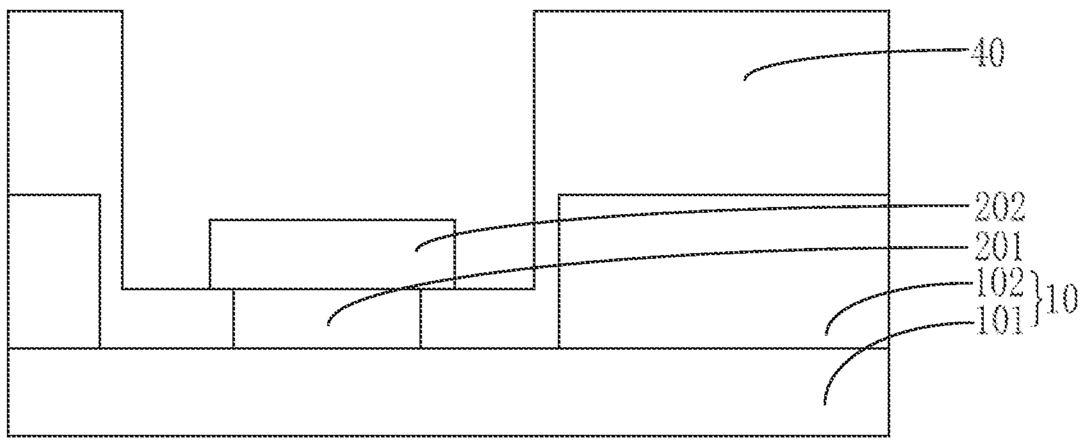
FIG. 2C is a schematic cross-sectional view of a third method for preparing a display panel provided by the present disclosure.

With reference to FIG. 2C, a first organic material with high fluidity is coated and filled the undercut groove 2.

Figure 2D:
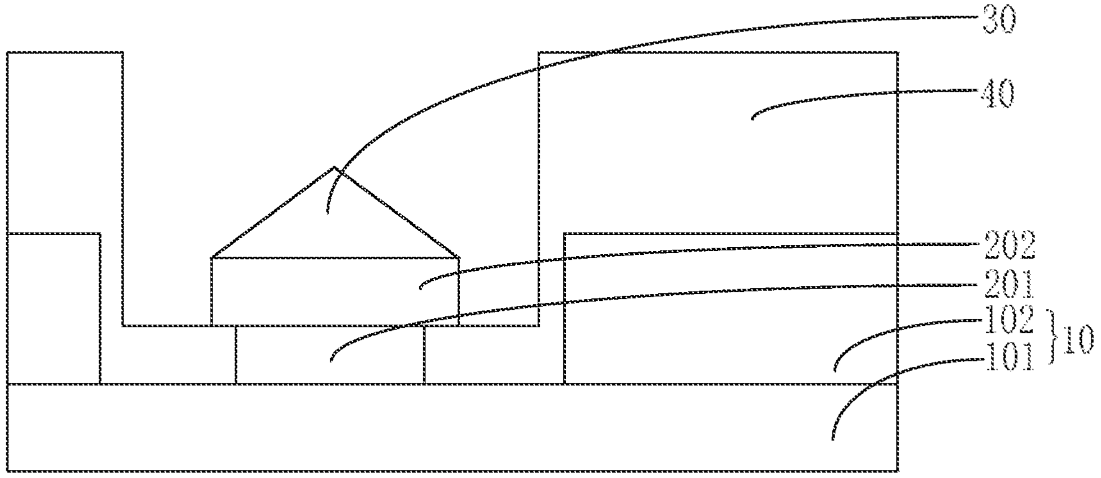
FIG. 2D is a schematic cross-sectional view of a fourth method for preparing a display panel provided by the present disclosure.

With reference to FIG. 2D, a second electrode 30 is prepared, and an upper surface of the second electrode 30 may be a tapered shape.

Figure 2E:
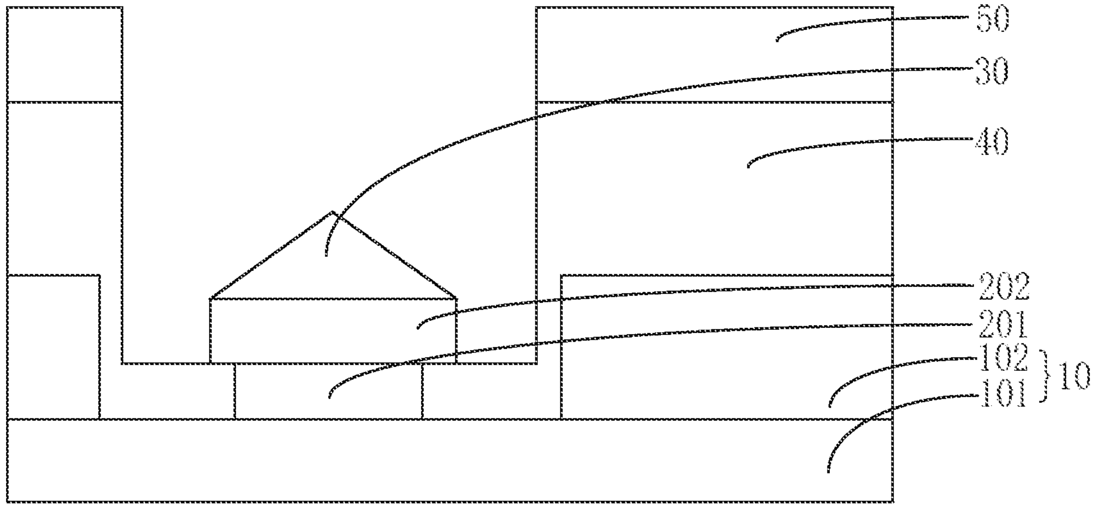
FIG. 2E is a schematic cross-sectional view of a fifth method for preparing a display panel provided by the present disclosure.

With reference to FIG. 2E, a second organic material is coated, and the first organic material and the second organic material on the undercut groove 2 are removed by exposure to obtain a planarization layer 40 and a pixel definition layer 50.

Figure 2F:
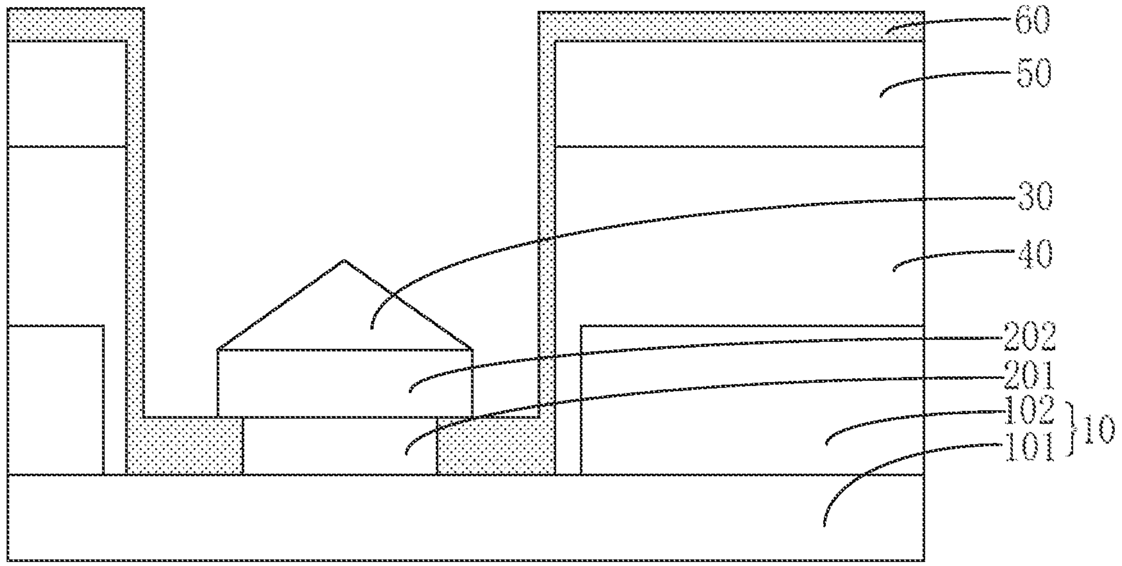
FIG. 2F is a schematic cross-sectional view of a sixth method for preparing a display panel provided by the present disclosure.

With reference to FIG. 2F, a light-emitting material layer 60 is prepared, and the undercut groove 2 is filled with the light-emitting material layer 60.

Figure 2G:
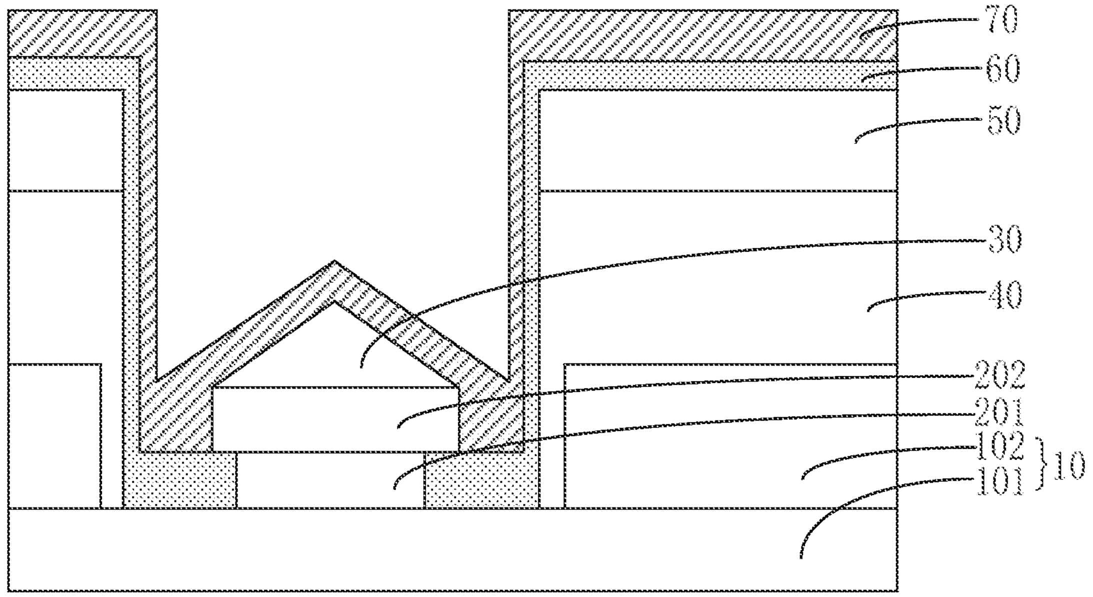
FIG. 2G is a schematic cross-sectional view of a seventh method for preparing a display panel provided by the present disclosure.
Figure 3:
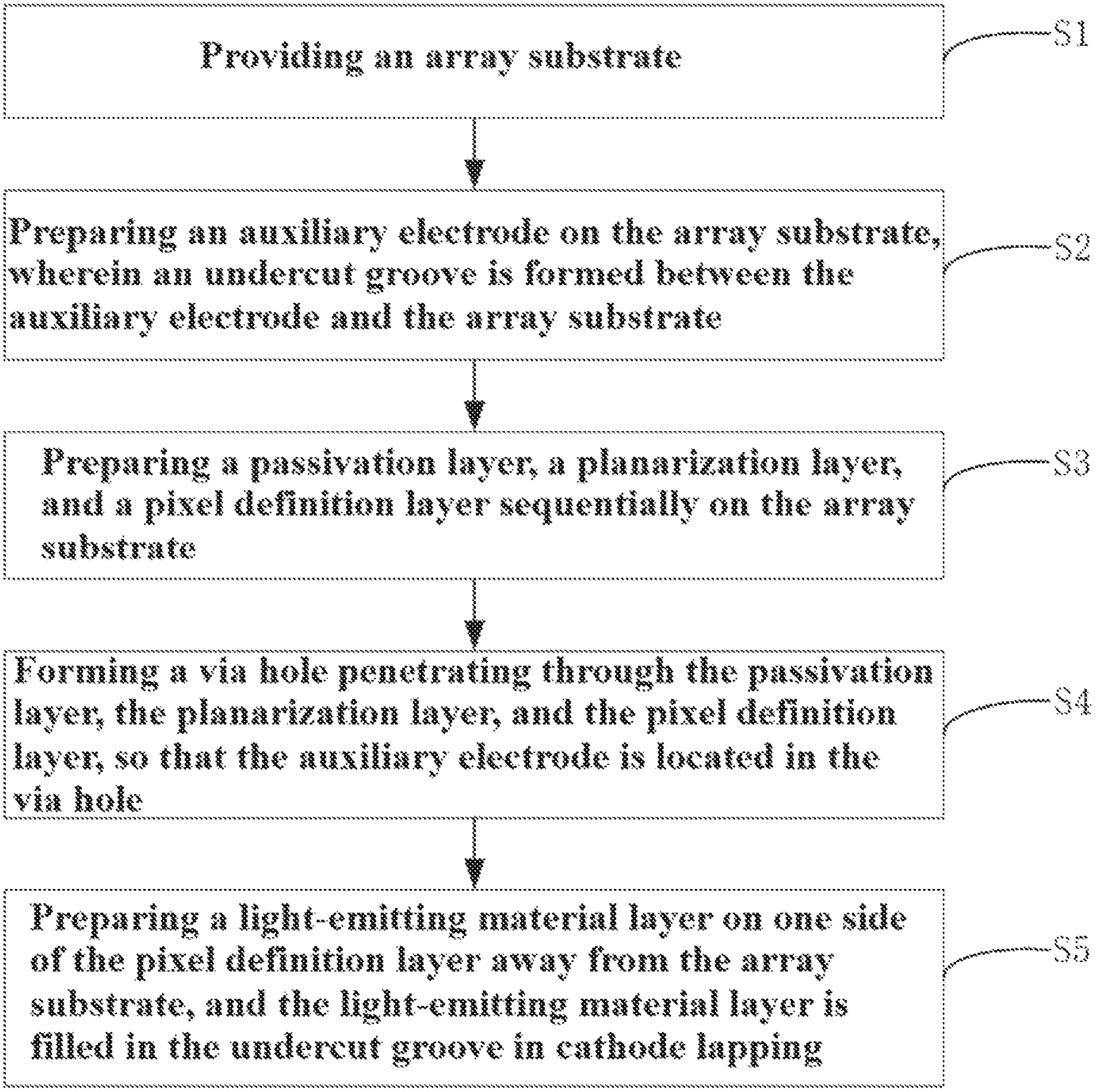
FIG. 3 is schematic flowchart of a method for preparing a display panel provided by the present disclosure.

With reference to FIG. 2G, a cathode 70 is prepared, and the cathode 70 is in surface contact with the second electrode 30 and the first electrode 20.

In an embodiment, the pixel definition layer 50 may be prepared by exposure using a semi-transparent mask.

In an embodiment, the method further comprises a step of preparing an auxiliary electrode, wherein the auxiliary electrode comprises a first portion 201 and a second portion 202 disposed on the first portion 201, and the step of preparing the auxiliary electrode comprises preparing an undercut groove 2 by etching the first electrode layer 20 through a photolithography process, wherein the second portion 202 covers the first portion 201, and a depth of the undercut groove 2 is greater than 2 microns.

In an embodiment, the step of preparing the planarization layer 40 and the pixel definition layer 50 further comprises: subjecting a first organic material and a second organic material to exposing in a one-step process to obtain the planarization layer 40 and the pixel definition layer 50, wherein the first organic material and the second organic material are the same.

In this embodiment, the planarization layer 40 and the pixel definition layer 50 are prepared in a one-step process, so that process is simplified and cost is reduced.

In an embodiment, the step of preparing the second electrode 30 further comprises: evaporating a layer of conductive material, and patterning the conductive material to form an upper surface of the second electrode in the shape of a triangular cone, and a lower surface of the second electrode 30 is disposed flush with the upper surface of the second portion 202.

The present disclosure further provides a display module and a display device, wherein both the display module and the display device comprise the above mentioned display panel, and details are not repeatedly described herein.

The display panel provided in this embodiment comprises a cathode lapping region. The cathode lapping region comprises an array substrate, an auxiliary electrode, a light-emitting material layer, and a cathode. An undercut groove is formed between the auxiliary electrode and the array substrate, and the undercut groove is filled with the light-emitting material layer. By forming the undercut groove between the auxiliary electrode and the array substrate, the light-emitting material layer can be filled in the undercut groove, the exposed auxiliary electrode can be in contact with the cathode, which increases contact area between the cathode and the auxiliary electrode, and reduces contact resistance of the cathode, thus reducing voltage drop in cathode.

In the above embodiments, description of each embodiment has its own emphasis. For parts not detailed in one embodiment, please refer to related description of other embodiments.

A display panel and a method for preparing the display panel provided in embodiments of the present disclosure are described in detail above. The principles and embodiments of the present disclosure are described by using specific examples herein. Descriptions of the above embodiments are merely intended to help understand the technical solutions and core ideas of the present disclosure. A person skilled in the art shall understand that it is still possible to modify the technical solutions described in the above embodiments, or equivalently substitute some of the technical features thereof. However, these modifications or substitutions do not make the essence of the corresponding technical solutions depart from scopes of the technical solutions of each embodiment of the present disclosure.

What is claimed is:

1. A display panel, comprising a cathode lap region, wherein the cathode lap region comprises:

an array substrate;

an auxiliary electrode disposed above the array substrate;

a light-emitting material layer disposed above the array substrate;

a cathode disposed on the light-emitting material layer and the auxiliary electrode, the cathode is lapped with the auxiliary electrode;

wherein a passivation layer, a planarization layer, and a pixel definition layer are further disposed sequentially on the array substrate, a via hole penetrating through the passivation layer, the planarization layer, and the pixel definition layer is disposed on the cathode lap region, the auxiliary electrode is disposed in the via hole, an undercut groove is formed between the auxiliary electrode and the array substrate, and the undercut groove is filled with the light-emitting material layer.

2. The display panel according to claim 1, wherein a surface of the auxiliary electrode away from the array substrate is disposed in a convex shape, and the convex faces toward one side away from the array substrate.

3. The display panel according to claim 2, wherein the auxiliary electrode comprises a first electrode and a second electrode disposed on one side of the first electrode away from the array substrate, the first electrode and the array substrate form the undercut groove, a surface of the second electrode away from the array substrate is disposed in a convex shape, and the convex faces toward one side of the array substrate away from the array substrate.

4. The display panel according to claim 3, wherein the array substrate comprises a substrate and a source and a drain on one side of the substrate, and the first electrode is disposed in the same layer as the source and the drain.

5. The display panel according to claim 4, wherein the display panel further comprises an anode connected to the source, and the second electrode is disposed in the same layer as the anode.

6. The display panel according to claim 3, wherein an upper surface of the second electrode is not disposed with a light-emitting material layer, and the cathode covers the second electrode.

7. The display panel according to claim 3, wherein the first electrode comprises a first portion, a second portion disposed on one side of the first portion away from the array substrate, and an orthographic projection of the first portion on the array substrate is smaller than an orthographic projection of the second portion on the array substrate.

8. The display panel according to claim 7, wherein the first portion and the second portion of the first electrode are integrally disposed.

9. The display panel according to claim 3, wherein a contact area of the cathode with the second electrode and the first electrode is larger than an area of an upper surface of the second electrode.

10. The display panel according to claim 3, the convex is a separate member, a material for preparing the convex is a conductive material, and the material for preparing the convex may be different from that of the second electrode.

11. The display panel according to claim 3, wherein the convex shape is a triangular cone shape, and a lower surface of the second electrode is in flush contact with the upper surface of the first electrode.

12. The display panel according to claim 11, wherein an angle range of an apex angle of the convex on one side away from the array substrate is greater than or equal to 60 degrees, and a thickness range of the convex is greater than or equal to 110 nm.

13. The display panel according to claim 2, wherein a pixel definition layer and a planarization layer are further disposed above the array substrate, and an orthographic projection of the pixel definition layer and the planarization layer on the substrate is staggered with an orthographic projection of the undercut groove on the substrate.

14. The display panel according to claim 13, wherein a material for preparing the pixel definition layer and the planarization layer is a positive photoresist material.

15. The display panel according to claim 3, wherein the cathode covers the second electrode.

16. The display panel according to claim 15, wherein the cathode is further partially disposed in the undercut groove, and a portion of the cathode located in the undercut groove may be in contact with one side of the first portion.

17. The display panel according to claim 1, wherein a lateral depth of the undercut groove is greater than 2 microns.

18. The display panel according to claim 3, wherein a material for preparing the second electrode and the cathode is selected from any one of indium tin oxide, indium zinc oxide, molybdenum titanium, and titanium.

19. A method for preparing a display panel, comprising:

providing an array substrate;

preparing an auxiliary electrode on the array substrate, wherein an undercut groove is formed between the auxiliary electrode and the array substrate;

preparing a passivation layer, a planarization layer, and a pixel definition layer sequentially on the array substrate;

forming a via hole penetrating through the passivation layer, the planarization layer, and the pixel definition layer, so that the auxiliary electrode is located in the via hole; and preparing a light-emitting material layer on one side of the pixel definition layer away from the array substrate, and the light-emitting material layer is filled in the undercut groove in cathode lap region.

20. The method according to claim 19, further comprising a step of preparing an auxiliary electrode, wherein the auxiliary electrode comprises a first portion and a second portion disposed on the first portion, and the step of preparing the auxiliary electrode comprises preparing an undercut groove by etching the first electrode layer through a photolithography process, wherein the second portion covers the first portion, and a depth of the undercut groove is greater than 2 microns.

* * * * *